(12) United States Patent
Yuen et al.

(10) Patent No.: US 6,934,661 B2
(45) Date of Patent: Aug. 23, 2005

(54) WAFER EDGE DETECTOR

(75) Inventors: Jean-Hua Yuen, Chang hua (TW);
Po-Ming Chen, Hsinchu (TW);
Ming-Ji Chiang, Hsinchu (TW);
Ji-Shen Yang, Hsinchu (TW)

(73) Assignee: Taiwan Semiconductor Manufacturing Co., Ltd., (TW)

( * ) Notice: Subject to any disclaimer, the term of this patent is extended or adjusted under 35 U.S.C. 154(b) by 0 days.

(21) Appl. No.: 10/737,370

(22) Filed: Dec. 16, 2003

(65) Prior Publication Data

US 2005/0140977 A1    Jun. 30, 2005

(51) Int. Cl.[7] .............................................. G06F 15/00
(52) U.S. Cl. ........................ 702/150; 414/935; 414/936
(58) Field of Search ........................ 702/150; 414/935, 414/936

(56) References Cited

U.S. PATENT DOCUMENTS

| | | | |
|---|---|---|---|
| 4,449,885 A | * | 5/1984 | Hertel et al. ............ 414/416.08 |
| 4,529,932 A | * | 7/1985 | Doueihi et al. ............. 324/161 |
| 4,752,898 A | * | 6/1988 | Koenig ........................ 356/400 |
| 4,880,348 A | * | 11/1989 | Baker et al. ................ 414/783 |
| 5,452,521 A | * | 9/1995 | Niewmierzycki ............. 33/520 |
| 5,483,138 A | * | 1/1996 | Shmookler et al. ..... 318/568.16 |
| 5,725,664 A | * | 3/1998 | Nanbu et al. .................. 118/52 |

\* cited by examiner

*Primary Examiner*—John E. Barlow
*Assistant Examiner*—Anthony T. Dougherty
(74) *Attorney, Agent, or Firm*—Duane Morris LLP

(57) ABSTRACT

A method for detecting wafer flat shift, and an apparatus (500) having two sensors (506a) and (506b) in a power supply circuit (600) for wafer fabrication equipment, the sensors (506a) and (506b) detecting a shift in wafer flat position from a desired position and shutting off the wafer fabrication equipment.

18 Claims, 5 Drawing Sheets

WAFER EDGE DETECTOR

FIELD OF THE INVENTION

The invention relates to automated fabrication of semiconductor integrated circuits on a wafer, and, more particularly, to detection of a wafer in a correct position for automated fabrication.

BACKGROUND

Semiconductor integrated circuits are fabricated in large numbers in successive layers of a semiconductor substrate. The integrated circuits are arranged in groups known as semiconductor dies, on the surface of the substrate. The substrate covers a silicon wafer.

One type of silicon wafer has a circular circumference that is truncated by a flat edge referred to as a wafer flat. The positions of the semiconductor dies are referenced to the wafer flat and the wafer center. Thus, the wafer flat is a reference, as is the wafer center.

During automated fabrication, a wafer holder or clamp grips the wafer by its edges. The wafer holder or clamp orients the wafer and guides the wafer through automated wafer fabrication equipment. The wafer flat is oriented relative to the clamp before the clamp transfers the wafer to the wafer fabrication equipment.

When the wafer is oriented improperly relative to the wafer fabrication equipment, the equipment can produce defects on the wafer surface, and some of the dies can become covered by the clamp and, thus, shielded from proper fabrication.

Prior to the invention, an edge detector detected the position of the wafer flat. However, the wafer might shift out of position, or the edge detector might fail to operate. There was no mechanism to detect the wafer shift, or to shut down the automated fabrication equipment upon detection of a wafer shift.

SUMMARY OF THE INVENTION

The invention relates to a method of detecting a shift in wafer flat position from a desired position; and shutting off the wafer fabrication equipment when the wafer flat position exceeds a set amount from the desired position. Apparatus for detecting the wafer flat shift has a frame, and two sensors in a power supply circuit for wafer fabrication equipment. The sensors detect a shift in wafer flat position from a desired position and shut off the wafer fabrication equipment.

DETAILED DESCRIPTION

Figure 1:
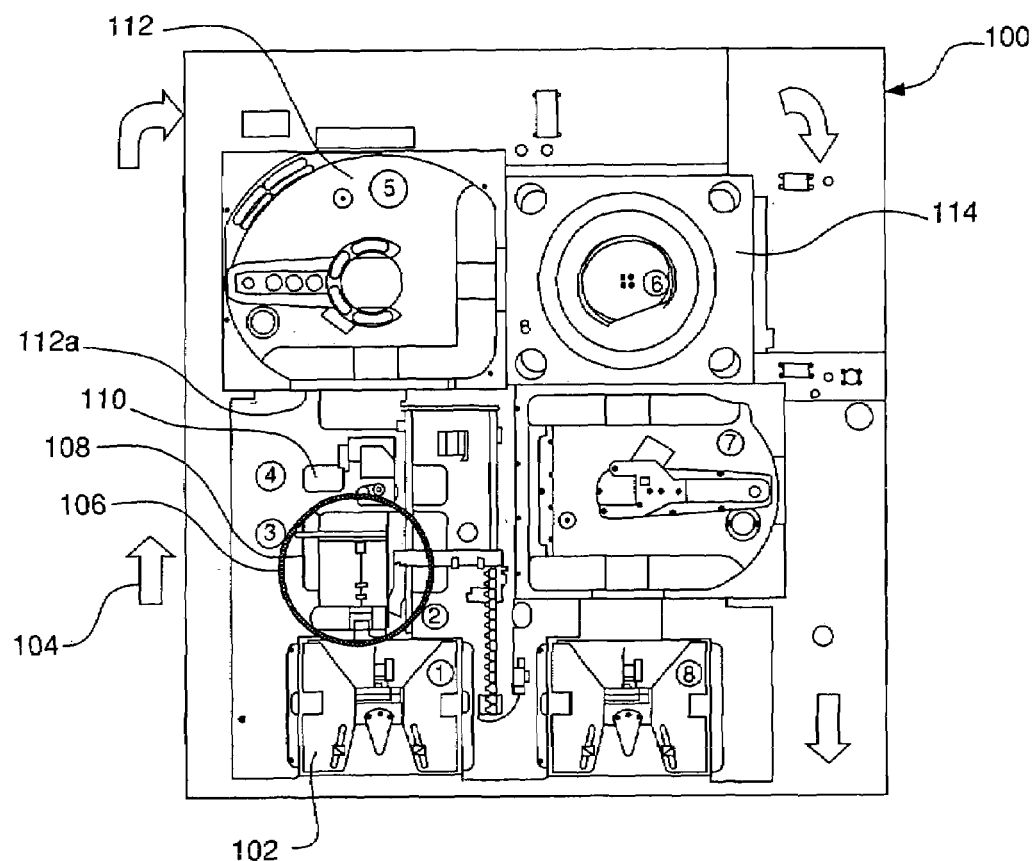
FIG. 1 is a top view of a wafer indexing and wafer clamping equipment.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIG. 1 discloses a wafer indexing and wafer clamping apparatus (100) of a wafer fabrication equipment that is known in the semiconductor processing industry. A wafer indexer (102) is in a beginning position 1 in the apparatus (100), and is indexed, in the direction of an arrow (104) to a position 2 where it receives a wafer (106). An edge detector (108) at 3 looks for the wafer flat. A lifter and spinner (110) at 4 spins the wafer (106) to angularly move the wafer flat into a position that is detected by the edge detector (108). Then the wafer indexer (102) transports the wafer (106) to an entrance load lock, ELL, or clamp (112) at 5. The entrance load lock or clamp (112) has an ELL outer door (112a) that closes and locks to lock the wafer (106) in position. The load lock or clamp (112) clamps the wafer (106) by its circular circumference to hold the wafer (106) during further fabrication of the wafer (106) for semiconductor fabrication. A four pin lifter (114) at 6 separates the indexer (102) from the wafer (106), while the wafer (106) is in the wafer fabrication equipment for further fabrication. The wafer (106) exits the load lock (112) at 7, and the indexer (102) is received at 8 for return to the beginning position at 1.

An example of the wafer fabrication equipment will now be discussed with reference to FIGS. 2A and 2B. One type of wafer fabrication equipment has an electrode (200) that is required to be covered completely by a wafer (106) in correct position. The load lock clamp (112) holds the wafer (106) while the wafer (106) is positioned over the electrode (200). The electrode (200) must be underneath all of the semiconductor dies. Further, the wafer (106) must completely cover the electrode (200) when the wafer surface is bombarded with plasma during a fabricating operation. A problem arises when the wafer (106) has shifted out of the correct position, and the electrode (200) becomes partially uncovered.

Figure 2A:
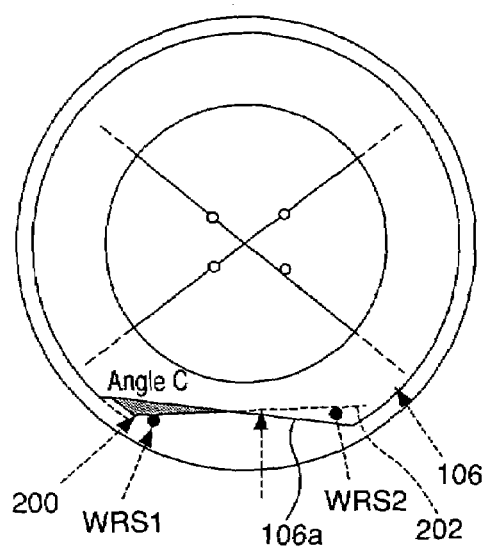
FIG. 2A is a diagrammatic view of a wafer that has shifted by rotation clockwise.
Figure 2B:
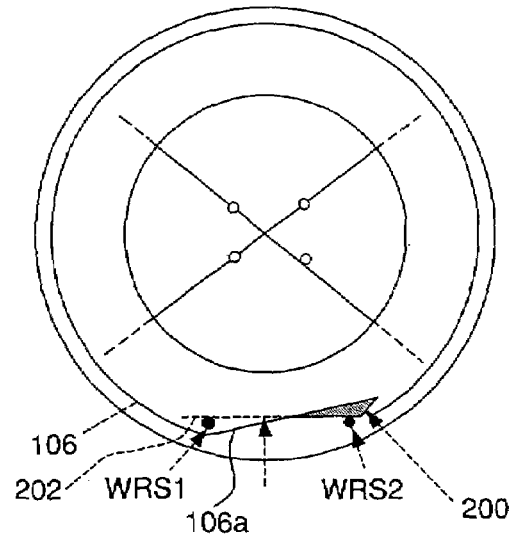
FIG. 2B is a diagrammatic view of a wafer that has shifted counterclockwise

FIG. 2A discloses a wafer (106) that has shifted out of the correct position (202) for the wafer flat (106a) by rotation clockwise. Thereby, the wafer flat (106a) has rotated clockwise to an angle C relative to the correct position (202) for the wafer flat (106a). FIG. 2B discloses a wafer (106) that has shifted counterclockwise from the correct position (202)

for the wafer flat (106a), by rotation counterclockwise. Thereby, the wafer flat (106a) has rotated counterclockwise relative to the correct position (202) for the wafer flat (106a). Either the wafer (106) shifts after being detected by the edge detector (108), or the edge detector (108) makes an error in detecting the wafer flat (106a). Then the wafer (106) is out of the correct position while being held by the load lock clamp (112). The wafer (106) is unable to completely cover the electrode (200). The electrode (200) partially protrudes from an edge of the wafer flat (106a). When the wafer surface is bombarded with plasma, some of the plasma unintentionally bombards the electrode (200), which creates airborne contaminant particles that fall on the semiconductor dies, and lowers production yield of the semiconductor circuits fabricated on the wafer (106).

Figure 3A:
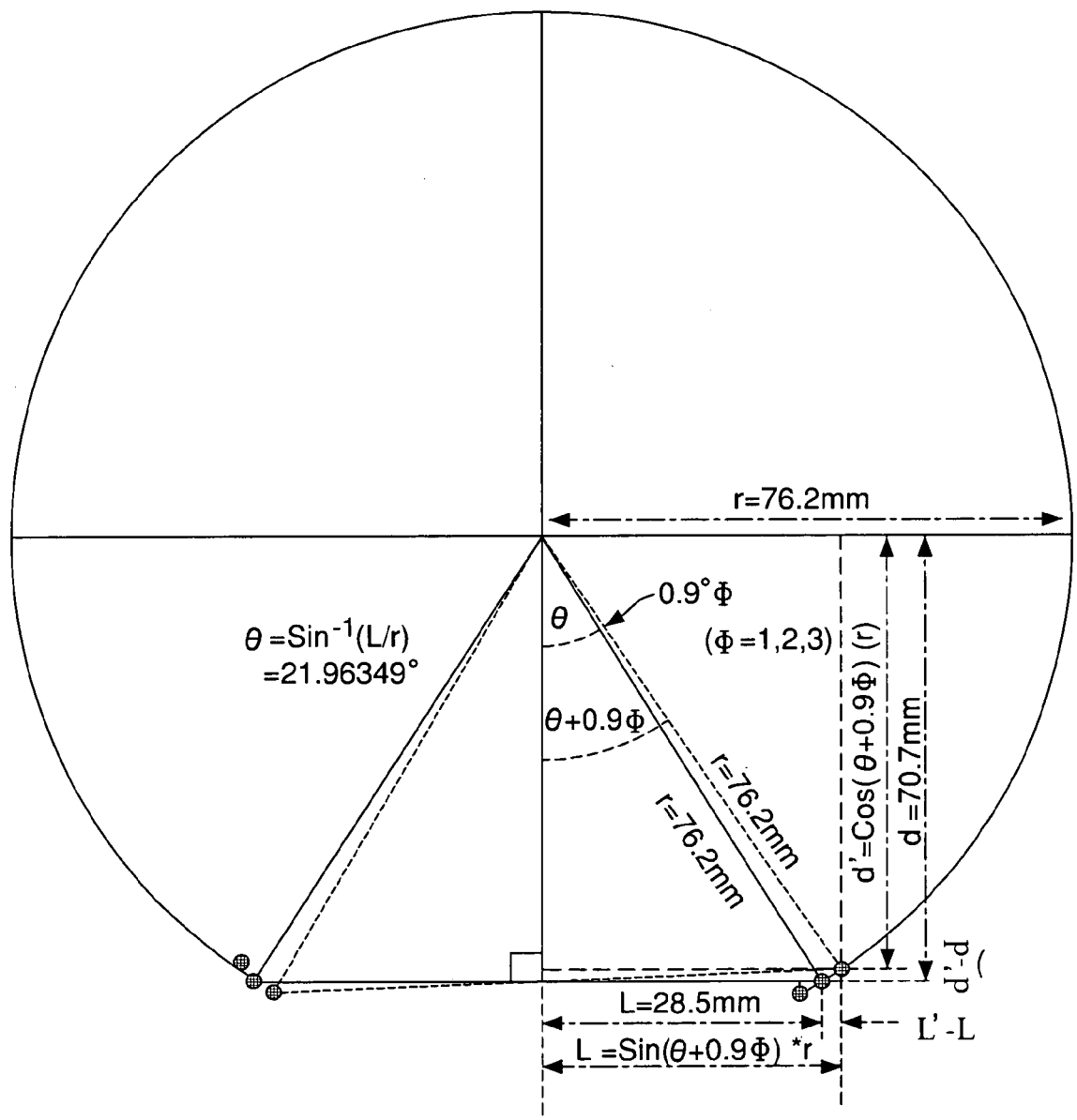
FIG. 3A is a diagrammatic view of measurements that quantify wafer flat shift.

FIG. 3A discloses dimensions of a six inch wafer (106), 152.4 mm wafer (106), with a radius, r=76.2 mm. The wafer (106) is shown as shifted out of position by being rotated counterclockwise by one count, resulting in offset values, (X, Y) along orthogonal axes X and Y in a horizontal plane;
wherein, one count, $\Phi=180°/200$, and
the offset value X=L'−L, and
the offset value Y=d'−d.

Figure 3B:
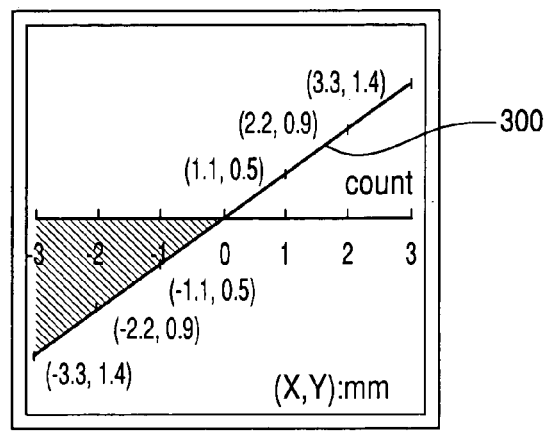
FIG. 3B is a graph disclosing offset values in counts of wafer flat shift.

FIG. 3B is a graph (300) of the values, (X, Y) corresponding to counts of shift of the wafer flat (106a).

Figure 4:
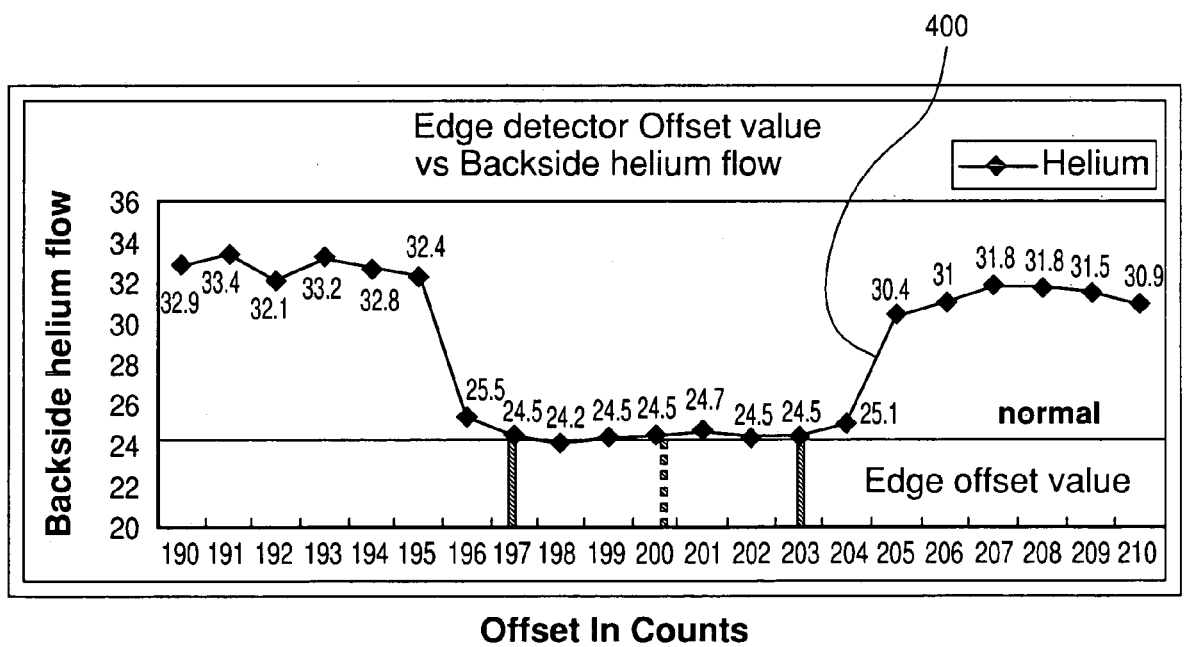
FIG. 4 is a graph of backside helium flow versus the offset values in counts.

FIG. 4 is a graph (400) of backside helium flow for backside Helium cooling (B/H) cooling, versus, the offset values in counts from a nominal count of 200. The equipment relies on Helium flow against the wafer backside to cool the wafer by conducting heat from the wafer to the electrode at lower temperature, and to displace air that would support an arc. However, the wafer flat (106a) could be shifted out of position by only two counts, equivalent to (2)(0.9°), of angular displacement, which is enough to require a helium flow pressure increase to cool the wafer adequately. The invention detects when the wafer flat (106a) is shifted out of position by only two counts.

When the wafer flat (106a) is shifted out of position by only five counts, angular displacement, (5)(0.9°), the clamp (112) covers some of the semiconductor dies, and reduces production yield of semiconductor circuits on the wafer (106).

When the wafer (106) has shifted out of the correct position, and is held by the clamp (112), the clamp (112) can cover a part of the top surface of the wafer (106), as shown by a dotted line (202). Some of the semiconductor dies can become shielded by the clamp (112), which lowers production yield of the semiconductor circuits fabricated on the wafer (106).

Figure 5A:
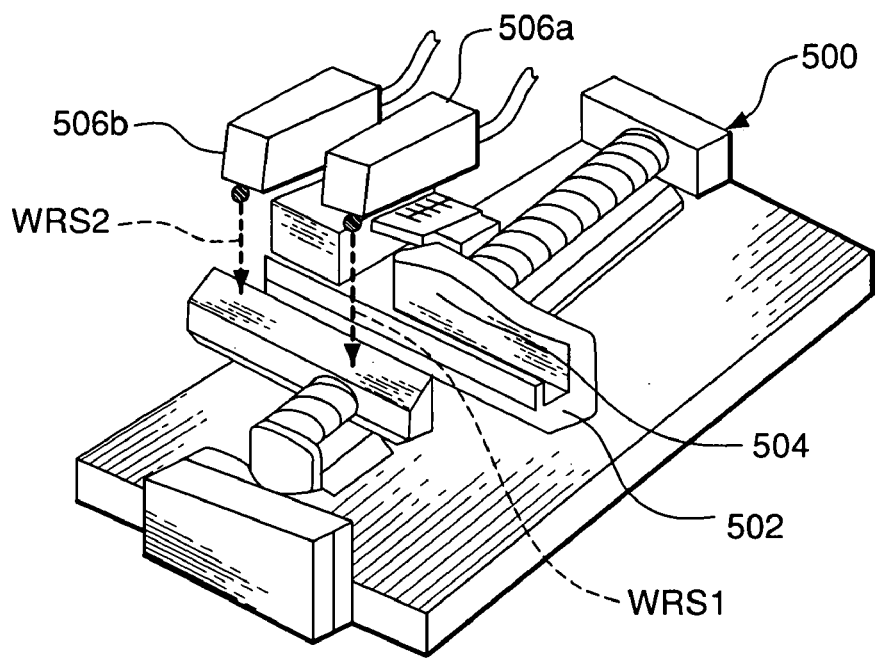
FIG. 5A is an isometric view of a wafer flat recognition apparatus.

FIG. 5A. discloses an embodiment of the invention. A wafer flat recognition apparatus (500) has a frame (502) having a detector support (504) on which are mounted two photoelectric sensors (506a) and (506b). The sensors (506a) and (506b) project outwardly horizontally from the detector support (504) to overhang an edge of a wafer flat (106a). FIG. 2A discloses that the sensors (506a) and (506b) project respective optical beam signals WRS1 and WRS2 that pass beside the edge of a wafer flat (106a) to detect the wafer flat (106a) in a correct position. The signals WRS1 and WRS2 are in a power supply circuit for semiconductor fabrication equipment. As disclosed by FIG. 2A, when the wafer (106) is misaligned by rotation clockwise, the wafer flat (106a) is rotated to intercept the optical beam signal WRS2. As disclosed by FIG. 2B, when the wafer (106) is misaligned by rotation counterclockwise, the wafer flat (106a) is rotated to intercept the optical beam signal WRS1. Either of the sensors (506a) and (506b) is disabled when its optical beam signal WRS1 or WRS2 is intercepted or interrupted by a misaligned wafer flat (106a), which triggers a signal to shut off the wafer fabrication equipment that is ready to perform a fabrication process on the wafer (106).

Figure 5B:
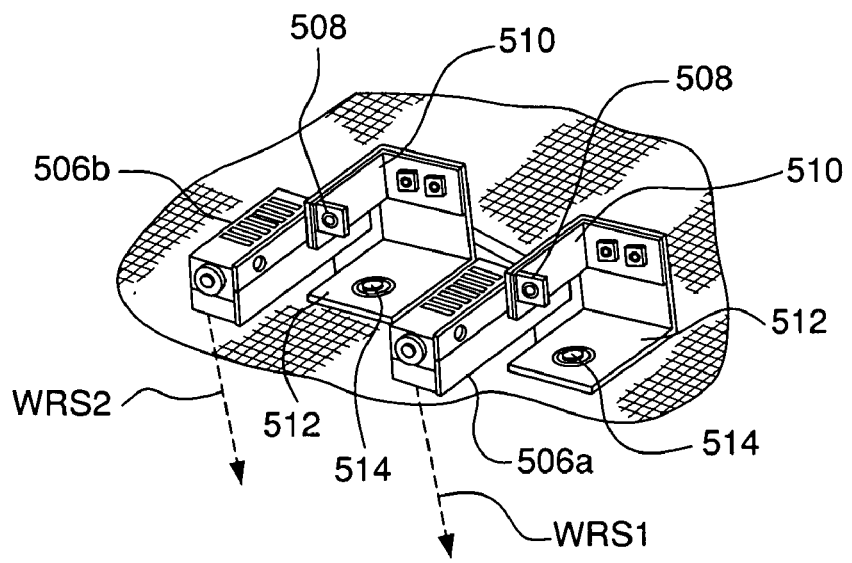
FIG. 5B is a fragmentary view of a portion of the apparatus disclosed by FIG. 5A.

The invention detects when the wafer flat 106a is shifted out of position that equals or exceeds only two counts, when an electrode (200) is required to be covered by the wafer (106). FIG. 5B discloses that each of the sensors (506a) and (506b) has an adjustable mounting mechanism, including, and not limited to structural features of the mounting mechanism that will now be described. Each of the sensors (506a) and (506b) is pivotally secured by an adjustment set screw (508) to pivot in a vertical plane while mounted on an L-shaped bracket (510). In turn, the bracket (510) is mounted on another count adjustment bracket (512) that is adjustable horizontally along the orthogonal X-Y axes that are disclosed by FIG. 3A. The bracket (512) is secured by an adjustment screw (514). The sensors (506a) and (506b) are set to project their beam signals WRS 1 and WRS 2 to intercept the X, Y values that correspond to the counts of wafer flat shift, as disclosed by FIG. 3B.

For example, in a fabrication equipment that requires coverage of an electrode (200), the sensors (506a) and (506b) are set by X-Y adjustment to detect a wafer flat (106a) that equals or exceeds two counts of wafer flat shift. When five counts of wafer flat shift are allowed by fabrication equipment, the sensors (506a) and (506b) are set by X-Y adjustment to detect a wafer flat (106a) that equals or exceeds five counts of wafer flat shift. For example, a fabrication equipment that does not have an electrode (200) can allow up to five counts of wafer flat shift. Thus, the sensors (506a) and (506b) are adjustable by the corresponding, adjustable mounting mechanisms to detect a wafer flat shift in the range of (2)(0.9°) to (5)(0.9°) angular displacement.

Figure 6:
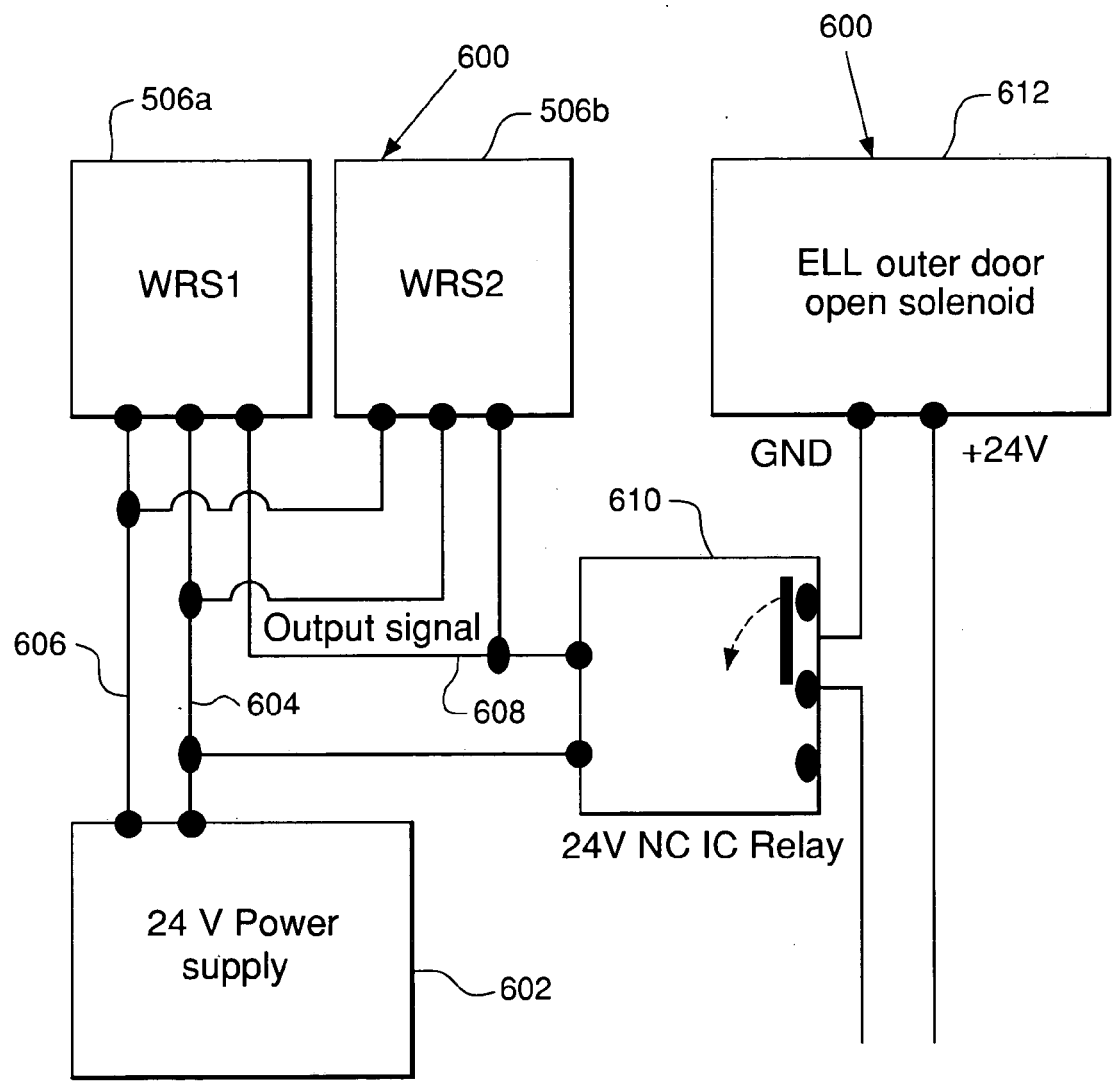
FIG. 6 is a circuit diagram of a control circuit.

FIG. 6 is a circuit diagram of a control circuit (600) for a wafer flat recognition system. The control circuit (600) has a 24 Volt power supply (602) supplying power over circuit line (604) to the sensors (506a) and (506b), and referenced to ground, GND, via ground circuit line (606) The sensors (506a) and (506b) supply output signals over output circuit line (608) to a 24 Volt NC integrated circuit IC relay (610). The relay (610) activates an ELL outer door open solenoid (612) that unlocks the ELL outer door (112a) for exit of the wafer (106) to a wafer fabrication equipment. When a wafer (106) shifts out of position, the wafer (106) will interrupt one of the sensors (506a) and (506b), causing an interruption of the sensor output signal over circuit line (608), which fails to activate the relay (610). Then, the ELL outer door (112a) will not open, causing shut off or shut down of the wafer fabrication equipment, because the wafer (106) is out of position. Thus, a wafer (106) that has shifted out of position shuts down the automated fabrication equipment to prevent low yield fabrication of the wafer (106).

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An apparatus for detecting wafer flat shift, comprising: a plurality of sensors and a relay for operating a solenoid in a power supply circuit for shutting off wafer fabrication equipment, the sensors for detecting a shift in wafer flat position; and the power supply circuit for shutting off the wafer fabrication equipment; wherein the relay receives signals from the sensors and the solenoid operated by the relay to open at least one door of the wafer fabrication equipment to release a corresponding wafer for further processing; and a wafer flat shift shutting off at least one of the signals from the sensors.

2. The apparatus of claim 1, wherein
the sensors being adjusted to detect a wafer flat shift in a plurality of directions of angular displacement.

3. The apparatus of claim 1, wherein
the sensors being adjusted to detect a wafer flat shift in a range of $(2)(0.9°)$ to $(5)(0.9°)$ angular displacement.

4. The apparatus of claim 1, further comprising:
a frame; and
an adjustable mounting mechanism mounting each of the sensors on the frame for adjustment along substantially orthogonal axes.

5. The apparatus of claim 1, further comprising:
a frame; and
the sensors being adjustably mounted on the frame.

6. A method of detecting wafer flat shift comprising the steps of:
detecting a wafer flat shift by an beam sensor, sending a signal from the sensors to a solenoid through a relay;
operating the solenoid by the relay to open at least one door of the wafer fabrication equipment to release a corresponding wafer for further processing;
shutting off at least one of the signals from the sensors by the wafer flat shift; and
shutting off a wafer fabrication equipment when the wafer flat shift exceeds a set amount.

7. The method as recited in claim 6, further comprising the step of:
detecting a wafer flat shift in a plurality of directions of angular displacement.

8. The method as recited in claim 6, further comprising the step of:
detecting the wafer flat shift by optical beam sensors.

9. The method as recited in claim 6, further comprising the step of:
detecting a wafer flat shift in a range of $(2)(0.9°)$ to $(5)(0.9°)$ angular displacement.

10. The method as recited in claim 6, further comprising the steps of:
detecting the wafer flat shift by optical beam sensors; and
adjusting the positions of the sensors.

11. The method as recited in claim 6, further comprising the step of:
detecting a wafer flat shift of $(2)(0.9°)$ angular displacement.

12. The method as recited in claim 6, further comprising the step of:
detecting a wafer flat shift of $(5)(0.9°)$ angular displacement.

13. A control circuit, comprising:
sensors to detect an edge of a wafer flat on a wafer;
a relay activated by outputs of the sensors;
a solenoid activated by the relay to unlock a door for exit of the wafer to equipment for further wafer fabrication; and
at least one of the sensors sensing a wafer flat shift, which shuts off the equipment.

14. The control circuit of claim 13, further comprising:
the sensors being set to detect a wafer flat shift of $(2)(0.9°)$ angular displacement.

15. The control circuit of claim 13, further comprising:
the sensors being set to detect a wafer flat shift of $(5)(0.9°)$ angular displacement.

16. The control circuit of claim 13, further comprising:
the sensors being mounted for adjustment along orthogonal axes corresponding to the a wafer flat shift in angular displacement.

17. The control circuit of claim 13, further comprising:
the sensors being adjustable on the frame.

18. The control circuit of claim 13, further comprising:
the sensors being adjustable along orthogonal axes.

* * * * *